(12) United States Patent
Hausdorf et al.

(10) Patent No.: US 7,176,670 B2
(45) Date of Patent: Feb. 13, 2007

(54) METHOD AND APPARATUS FOR ZERO-MIXING SPECTRUM ANALYSIS WITH HILBERT TRANSFORM

(75) Inventors: Reiner Hausdorf, Ottobrunn (DE); Pavel Baros, Hrusovany N. Sev. (CZ); Roman Striz, Frydlant N.O. (CZ)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 11/236,226

(22) Filed: Sep. 27, 2005

(65) Prior Publication Data

US 2006/0066290 A1 Mar. 30, 2006

(30) Foreign Application Priority Data

Sep. 27, 2004 (EP) .................. 04022986

(51) Int. Cl.
*G01R 13/24* (2006.01)
*G01R 23/00* (2006.01)

(52) U.S. Cl. .................. 324/76.27; 324/76.19

(58) Field of Classification Search ............. 324/76.27, 324/76.19
See application file for complete search history.

(56) References Cited

U.S. PATENT DOCUMENTS

| | | | |
|---|---|---|---|
| 4,803,739 A * | 2/1989 | Daikoku et al. ............... | 455/47 |
| 5,736,845 A * | 4/1998 | Kosuge .................. | 324/76.27 |
| 6,140,809 A * | 10/2000 | Doi ......................... | 324/76.24 |
| 6,275,020 B1 | 8/2001 | Nagano ................... | 324/76.27 |
| 6,901,353 B1 * | 5/2005 | Huang ....................... | 702/189 |
| 7,099,016 B2 * | 8/2006 | Baros et al. ................ | 356/484 |
| 2002/0121892 A1 * | 9/2002 | Vandersteen et al. ....... | 324/118 |

FOREIGN PATENT DOCUMENTS

WO WO 03/069359 A1 8/2003

OTHER PUBLICATIONS

Search Report.

* cited by examiner

*Primary Examiner*—Andrew H. Hirshfeld
*Assistant Examiner*—Jeff Natalini
(74) *Attorney, Agent, or Firm*—Ditthavong Mori & Steiner, P.C.

(57) ABSTRACT

An apparatus for analyzing a spectrum of an input signal ($\chi(t)$) having at least one line with a center frequency ($\hat{\omega}_x$) at the center of the line includes: a mixer for zero-mixing the input signal ($\chi(t)$) to produce a base band signal ($z(t)$) by sweeping a local oscillator frequency ($\omega_s$) generated by a local oscillator, a resolution filter for filtering the base band signal ($z(t)$) to produce a filtered base band signal ($y(t)$), and an envelope reconstruction means for reconstructing the envelope ($E(\omega)$) of the spectrum of the input signal ($\chi(t)$) by using an estimated amplitude ($\hat{y}_x$) at an estimated center frequency ($\hat{\omega}_x$) of each line of the input signal ($\chi(t)$). Further, only the real component (I) of the base band signal ($z(t)$) is filtered with the resolution filter and the imaginary component (Q) is generated from the filtered base band signal ($y(t)$) by performing a Hilbert transform in a Hilbert filter arranged downstream of the resolution filter.

16 Claims, 13 Drawing Sheets state of the art

METHOD AND APPARATUS FOR ZERO-MIXING SPECTRUM ANALYSIS WITH HILBERT TRANSFORM

BACKGROUND OF THE INVENTION

The invention concerns to a method and an apparatus for zero-mixing spectrum analysis.

For example from U.S. Pat. No. 5,736,845 a spectrum analyzer with two step down conversion to the base band is known. In a first down conversion stage with a variable first local oscillator and a first mixer the input signal is transferred to an intermediate frequency. At a second stage with a constant second local oscillator and a second mixer the intermediate frequency is transferred to the base band. This configuration of spectrum analyzer is widely used. However, the two mixer stages are costly and thus it is desirable to have a spectrum analyzer with only one mixer stage. Such a concept is known as zero-mixing concept, which means that the input signal is directly converted to the base band.

The problem in frequency spectrum analyzers using the zero-mixing concept is the problem that surging occurs when the local oscillator frequency approaches the center frequency of one of the lines within the input signal. The envelope of the spectrum of the input signal has to be reconstructed. The central peak, i.e. the amplitude of the signal beyond the resolution filter when the frequency of the local oscillator equals one of the center frequencies of the lines of the input signal, strongly depends on the phase difference between the input frequency component and the sweep signal of the local oscillator. Thus no linear interpolation can reconstruct the spectrum envelope near the central peak.

In WO 03/069359 A1 it is proposed to reconstruct the envelope of the spectrum of the input signal by the use of an estimated amplitude at an estimated center frequency of each line of the input signal, whereby the estimated amplitude and the estimated center frequency are calculated from the time of occurrence, the duration and the maximum value of several halfwaves (wavelets) of the filtered base band signal. In the vicinity of the center frequency of each of the lines of the input signal, the signal outputted from the resolution filter is a surging signal which can be divided into several halfwaves (wavelets). For several halfwaves (wavelets) in the vicinity of the center frequency (when the frequency of the local oscillator approaches or leaves the center frequency) the time of occurrence, the duration and the maximum value of each halfwave are evaluated. It has been found that from the time of occurrence, the duration and the maximum value of several halfwaves an estimated center frequency and an estimated amplitude at the center frequency can be calculated. If the center frequency and the amplitude at the center frequency of each line of the input signal are known, the envelope of the input signal can be reconstructed near the center frequency.

It is a disadvantage of the method and apparatus know from WO 03/069359 A1 that the method is only performed for the real component of the complex base band signal. Thus, the number of halfwaves (wavelets) is restricted. Thus, for a sufficient accuracy of this method the sweep velocity must be limited.

SUMMARY OF THE INVENTION

It is the object of the present invention to improve the known method and the known apparatus in a manner to provide further halfwaves (wavelets) in order to speed up the procedure of reconstructing the envelope.

The object is solved by the features of claim 1 as concerns the method and by the features of claim 9 as concerns the apparatus. The dependent claims comprise further developments of the invention.

According to the invention only the real component of the base band signal is filtered with the resolution filter and the imaginary component is generated from the real component of the filtered base band signal by performing a Hilbert transform.

The reconstruction of the envelope of the spectrum of the input signal can then preferably be done on the basis of the real component and on the basis of the imaginary component generated with the Hilbert transform.

Preferably the real component of the filtered base band signal is delayed by a delay time equivalent to the processing time of the Hilbert transform in order to enable synchronized further processing of the real component and of the imaginary component. Preferably the amplitude values of the imaginary component generated by performing the Hilbert transform are corrected by an estimation on the basis of the neighboring amplitude values of the real component.

The Hilbert transform can be performed in a Hilbert filter, which can be a digital finite impulse response filter (FIR-filter) having specific coefficients as outlined in the dependent claims.

BRIEF DESCRIPTION OF THE DRAWINGS

The concept and the advantages of the present invention can be better understood from an embodiment of the invention which is explained vis-à-vis the state of art embodiment with reference to the drawing. In the drawing

FIG. 22A to

For a better understanding of the differences and improvements of the present invention vis-à-vis the state of art known from WO 03/069359 A1 FIG. 1 shows a block diagram of the known apparatus 1 for zero-mixing spectrum analysis. An input signal x(t), which has to be analyzed, is provided to a mixer 2. To facilitate the description it is assumed that the input signal is a sinus-signal having only one circle frequency $\omega_x$. The input signal can thus be expressed as $$x(t)=\sin(\omega_x \cdot t+\phi) \quad (1)$$

Figure 1:
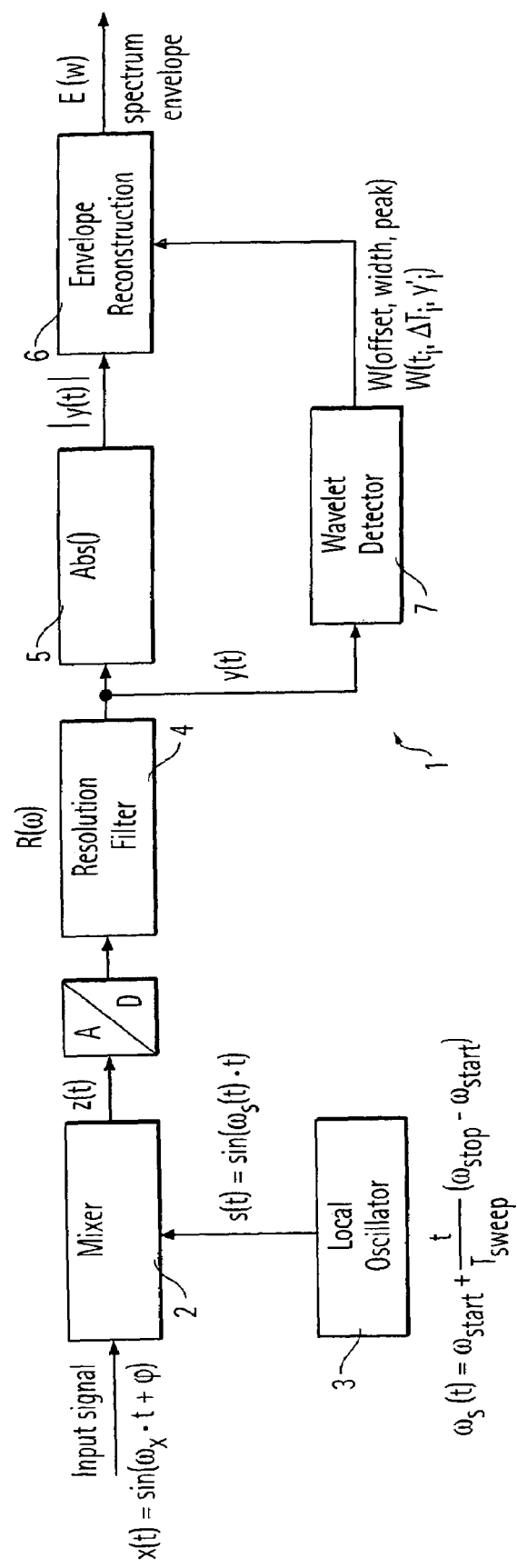
FIG. 1 shows a block diagram of the state of art zero-mixing spectrum analyzer.

In general, however, the input signal is a superposition of several spectral lines. For each spectral line of the spectrum of the input signal there is a center frequency $\omega_{x,i}$. For the present simplified case there is only one center frequency $\omega_x$. $\phi$ is a phase shift with respect to the signal s(t) provided by a local oscillator 3 and fed to mixer 2. The signal s(t) of the local oscillator 3 can be expressed as a function of time t as follows:

$$s(t)=\sin(\omega_s(t)\cdot t) \quad (2)$$

The circle frequency $\omega_s$ of the local oscillator 3 is not constant but a function of time t as the local oscillator is swept from a start circle frequency $\omega_{start}$ to a stop circle frequency $\omega_{stop}$ within the sweep time $T_{sweep}$. The actual circle frequency $\omega_s(t)$ of the local oscillator 3 can be expressed as a function of time t as follows:

$$\omega_s(t) = \omega_{start} + \frac{t}{T_{sweep}}(\omega_{stop} - \omega_{start}) \quad (3)$$

DESCRIPTION OF THE PREFERRED EMBODIMENT

As already explained in the opening part of the description, the concept is related to the zero-mixing concept. This means that mixer 2 does not convert the input signal x(t) to an intermediate frequency, but the input signal x(t) is directly converted to the base band. Base band signal z(t) is transferred to the resolution filter 4 having the resolution filter frequency response $R(\omega)$.

The output signal y(t) of the resolution filter 4 is transferred to absolute value means 5, which outputs the absolute values |y(t)| of the filtered base band signal y(t). The absolute values of the filtered base band signal |y(t)| are transferred to envelope reconstruction means 6 for reconstructing the spectrum envelope $E(\omega)$ of the input signal.

However, only on the basis of the absolute values of a filtered base band signal |y(t)| would the reconstruction of the envelope be rather inaccurate in the vicinity of the center frequency $\omega_x$, which will be explained later on with respect to FIGS. 2 and 3. Thus, detector means 7 is connected to the output of the resolution filter 4 and is provided with the filtered base band signal y(t). Detector means 7 detects the time of occurrence $t_i$ (offset), the duration $\Delta T_i$ (width) and the maximum absolute value $y'_i$ (peak) of several halfwaves (wavelets) of the filtered base band signal y(t). This data are fed to envelope reconstruction means 6 and used for spectrum envelope reconstruction in the vicinity of the center frequency $\omega_x$ as will be explained in detail later on.

For a better understanding FIGS. 2A, 2B, 3A and 3B show the absolute values |y| of the filtered base band signal y as a function of the actual frequency $\omega_s$ of the sweep signal s. As, according to equation (3), the actual frequency $\omega_s(t)$ of the sweep signal s is a linear function of time t, FIGS. 2A to 3B at the same time show the signal y as a function of time of measurement t.

Figure 2A:
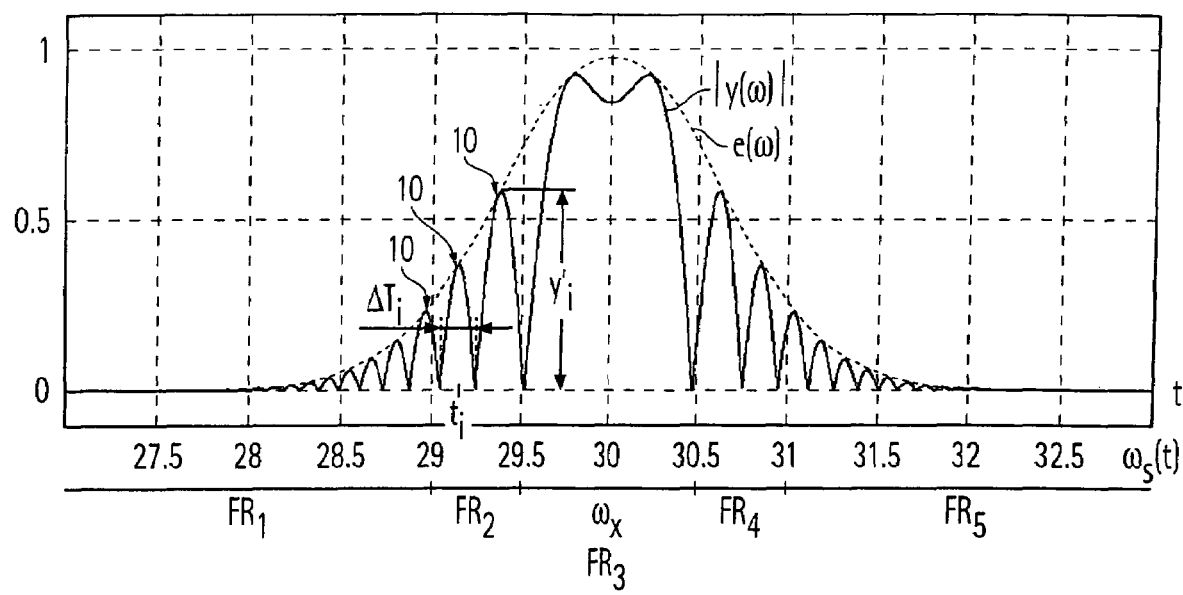
FIG. 2A shows the signal beyond the resolution filter and the spectrum envelope reconstructed only on the basis of the filtered base signal for a fast sweep and a phase difference between the input signal and the sweep signal of the local oscillator of $\phi=0.2\pi$.
Figure 2B:
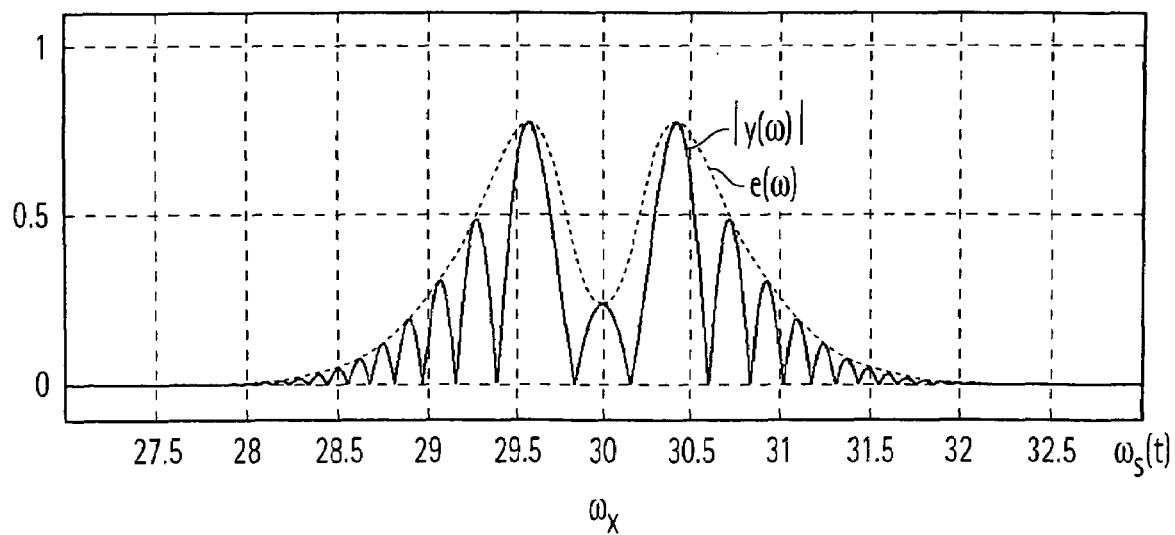
FIG. 2B shows the signal beyond the resolution filter and the spectrum envelope reconstructed only on the basis of the filtered base signal for a fast sweep and a phase difference between the input signal and the sweep signal of the local oscillator of $\phi=0.6\pi$.

FIGS. 2A and 2B show a fast sweep measurement, i.e. the total sweep time $T_{sweep}$ in equation (3) is rather short. The total sweep time $T_{sweep}$ is the same for FIGS. 2A and 2B, but for FIG. 2A the phase difference $\phi$ between the input signal x and the sweep signal s is $\phi=0.2\pi$ and for FIG. 2B the phase difference $\phi$ between the input signal x and the sweep signal s is $\phi=0.6\pi$. It can be obtained from FIGS. 2A and 2B that a surging occurs when the actual frequency $\omega_s(t)$ approaches the center frequency $\omega_x$ or leaves the center frequency $\omega_x$ of the input signal. The surging frequency is the actual frequency $\tilde{\omega}_y$ of the filtered base band signal y(t). The relation between the actual circle frequency $\tilde{\omega}_{y,i}$ for halfwave (wavelet) i, the actual frequency $\omega_s$ at time of occurrence $t_i$, when halfwave (wavelet) i occurs, and the center frequency $\omega_x$ of the input signal can be expressed as follows:

$$\omega_x=\omega_s(t=t_i)+\tilde{\omega}_{y,i} \text{ sweep is approaching } \omega_x \quad (4)$$

$$\omega_x=\omega_s(t=t_i)-\tilde{\omega}_{y,i} \text{ sweep is leaving } \omega_x \quad (5)$$

The equation (4) is true when the sweep is approaching center frequency $\omega_x$ ($\omega_s<\omega_x$). Equation (5) is true when the sweep is leaving $\omega_x$ ($\omega_s>\omega_x$).

An attempt can be made to reconstruct the envelope of the spectrum of the input signal by fitting an envelope function $e(\omega)$ through the absolute maxima $y'_i$ of the absolute values |y| of the filtered base band signal y as shown in FIGS. 2A and 2B. This reconstruction method is successful in a frequency range $FR_1$ and $FR_5$ far from the center frequency $\omega_x$ of the input signal. However, in the vicinity of the center frequency $\omega_x$ this approach is not successful as the peaks of the absolute values |y| of the filtered base band signal y near the center frequency $\omega_x$ strongly depend on the phase difference $\phi$ between the input signal x and the sweep signal s. This can be seen by comparing FIGS. 2A and FIG. 2B. As already mentioned the phase difference $\phi$ is $\phi=0.2\pi$ in FIG. 2A and $\phi=0.6\pi$ in FIG. 2B. In the case of FIG. 2B a small maximum occurs at the center frequency $\omega_x$ leading to a minimum of curve $e(\omega)$. Thus this approach is totally unreliable in the frequency range $FR_3$ and cannot be used as a single method in frequency ranges $FR_2$ and $FR_4$. Only in frequency ranges $FR_1$ and $FR_5$ can this method be used.

Figure 3A:
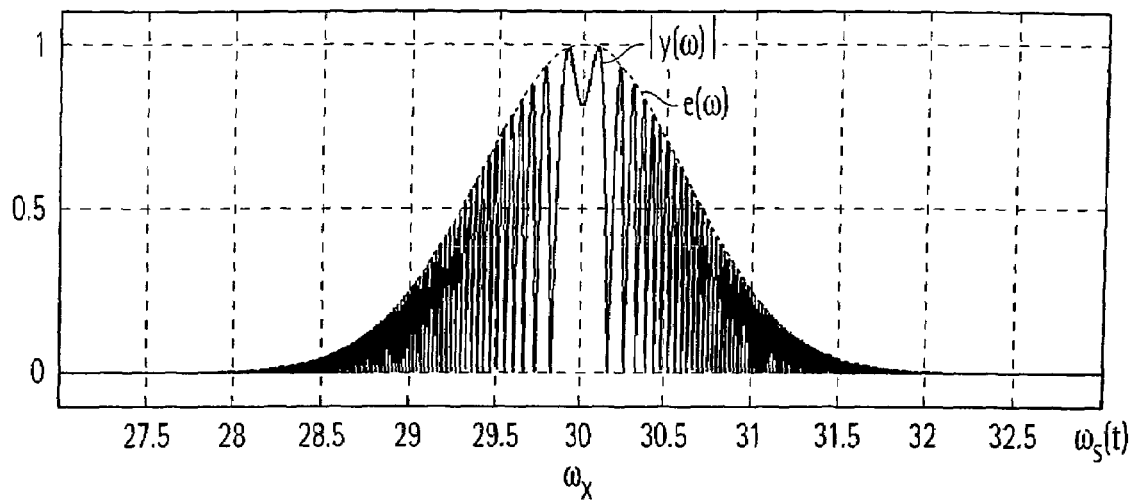
FIG. 3A shows the signal beyond the resolution filter and the spectrum envelope reconstructed only on the basis of the base signal for a slow sweep and a phase difference between the input signal and the sweep signal of the local oscillator of $\phi=0.2\pi$.
Figure 3B:
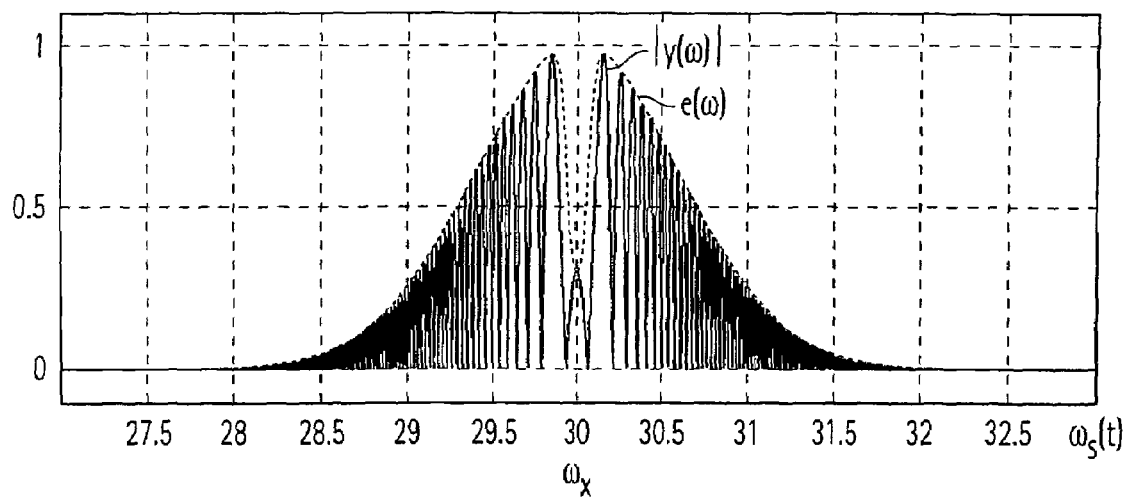
FIG. 3B shows the signal beyond the resolution filter and the spectrum envelope reconstructed only on the basis of the base signal for a fast sweep and a phase difference between the input signal and the sweep signal of the local oscillator of $\phi=0.6\pi$.

The same effect appears to be true for the fast sweep situation shown in FIG. 3A for phase difference $\phi=0.2\pi$ and shown in FIG. 3B for phase difference $\phi=0.6\pi$.

An estimation of the center frequency $\omega_x$ and of the amplitude $y_x$ at the center frequency $\omega_x$ is made on the basis of the time of occurrence ("offset") $t_i$, the duration ("width") $\Delta T_i$ and the maximum absolute value $y'_i$ of several halfwaves (wavelets) i. i is the index of the halfwave $t_i$, $\Delta T_i$ and $y'_i$ are indicated for one of the halfwaves in FIG. 2A.

The duration ("width") $\Delta T_i$ of the halfwave (wavelet) is half of the period and thus is related to the actual frequency $\tilde{\omega}_{y,i}$ of base band signal y by $$\tilde{\omega}_{y,i} = \frac{2\pi}{2 \cdot \Delta T_i} = \frac{\pi}{\Delta T_i} \tag{6}$$

Inserting equation (6) in equations (4) and (5) leads to $$\hat{\omega}_{x,i} = \omega_s(t=t_i) \pm \frac{\pi}{\Delta T_i} \tag{7}$$

An estimated value for the center frequency $\hat{\omega}_{x,i}$ is obtained by equation (7) from the time of occurrence ("offset") $t_i$ and the duration ("width") $\Delta T_i$ for each evaluated halfwave (wavelet) i individually.

Since the resolution filter frequency response $R(\omega)$ is known, an estimated amplitude value $\hat{y}_{x,i}$ can be obtained from the absolute maximum value (peak) $y'_i$ of the evaluated halfwave (wavelet) i and the duration ("width") $\Delta T_i$ of the evaluated halfwave i by $$\hat{y}_{x,i} = \frac{y'_i}{R(\tilde{\omega}_{y,i})} = \frac{y'_i}{R\left(\frac{\pi}{\Delta T_i}\right)} \tag{8}$$

From formulas (7) and (8) an estimated value of the center frequency $\hat{\omega}_{x,i}$ and an estimated amplitude value $\hat{y}_{x,i}$ at the center frequency are obtained for each evaluated halfwave (wavelet) individually. The different values obtained from the different halfwaves have to be averaged. Preferably not all values of all evaluated halfwaves are included in the averaging procedure.

Figure 4:
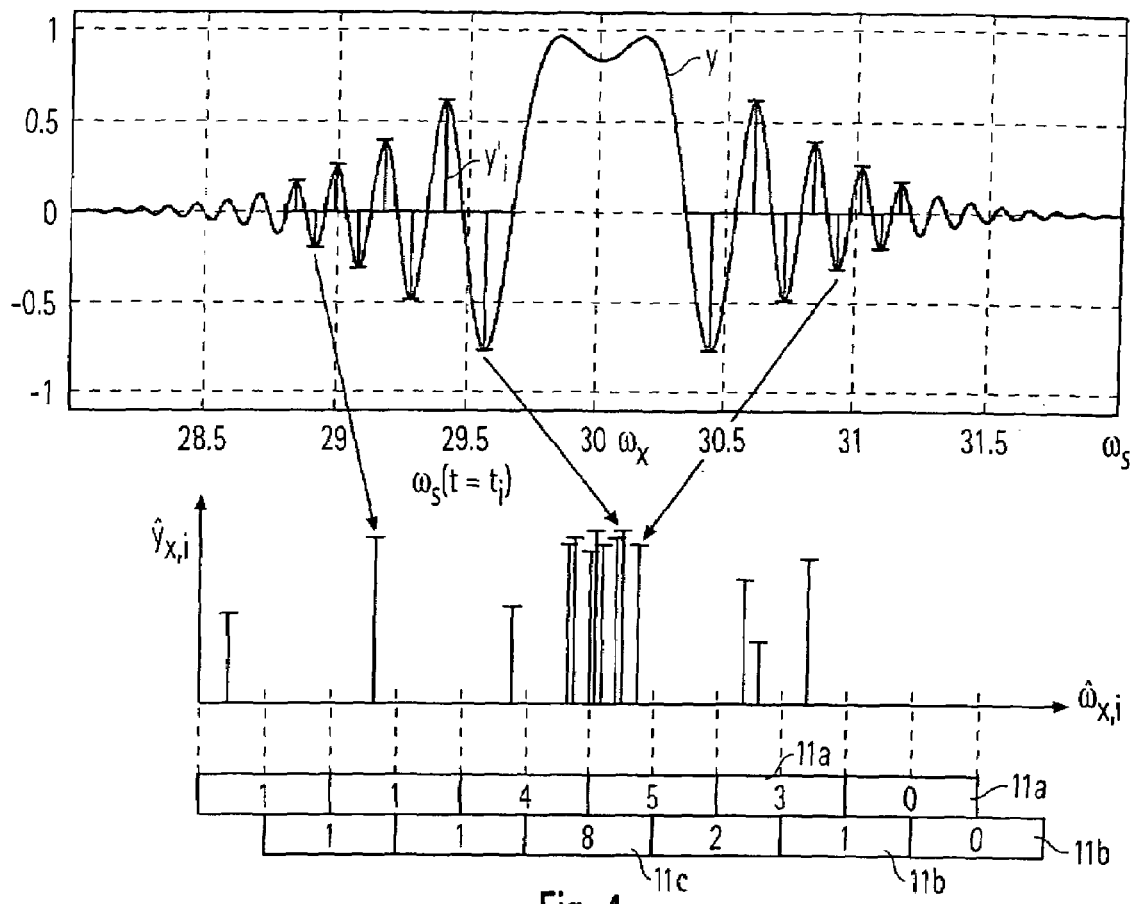
FIG. 4 shows a schematic diagram illustrating the selection of halfwaves (wavelets) used for averaging.

Only the estimated values of distinguished halfwaves (wavelets) are used for averaging. To select the suitable values, the frequency range is divided into intervals $11a$, $11b$ as shown in FIG. 4. Preferably there is a first set of intervals $11a$ and a second set of intervals $11b$, whereby the second set of intervals $11b$ is overlapping the first set of intervals $11a$ most preferably by 50%. Each estimated value for the center frequency $\hat{\omega}_{x,i}$ is related to these intervals. Each time $\hat{\omega}_{x,i}$ of a certain halfwave (wavelet) falls into a specific interval, a count is assigned to this interval, i.e. a counter for this interval is incremented. After having related all values $\hat{\omega}_{x,i}$ of all evaluated halfwaves (wavelets) to the intervals $11a$, $11b$, distinguished intervals are selected which have a minimum number of counts. This threshold of minimum number of counts must be determined experimentally as a fraction of nominal wavelet count (NWC), which is the theoretical maximum of wavelets per classification interval $11a$, $11b$. A well working minimum number of counts appears to be around 0.9 of the nominal wavelet count.

In FIG. 4 it is shown how the estimated values for the halfwaves (wavelets) are projected into the intervals. The number of counts is indicated for each interval $11a$, $11b$. In the present example only interval $11c$ having the highest number of 8 counts is selected for averaging. This means that all estimated values of the center frequency $\hat{\omega}_{x,i}$ and all estimated amplitude values $\hat{y}_{x,i}$ of the selected interval $11c$ are added and divided by the number of counts n of the selected interval $11c$ as follows (in the example n=8):

$$\hat{\omega}_x = \frac{1}{n}\sum_{i=1}^{n} \hat{\omega}_{x,i} \tag{9}$$

$$\hat{y}_x = \frac{1}{n}\sum_{i=1}^{n} \hat{y}_{x,i} \tag{10}$$

Figure 5:
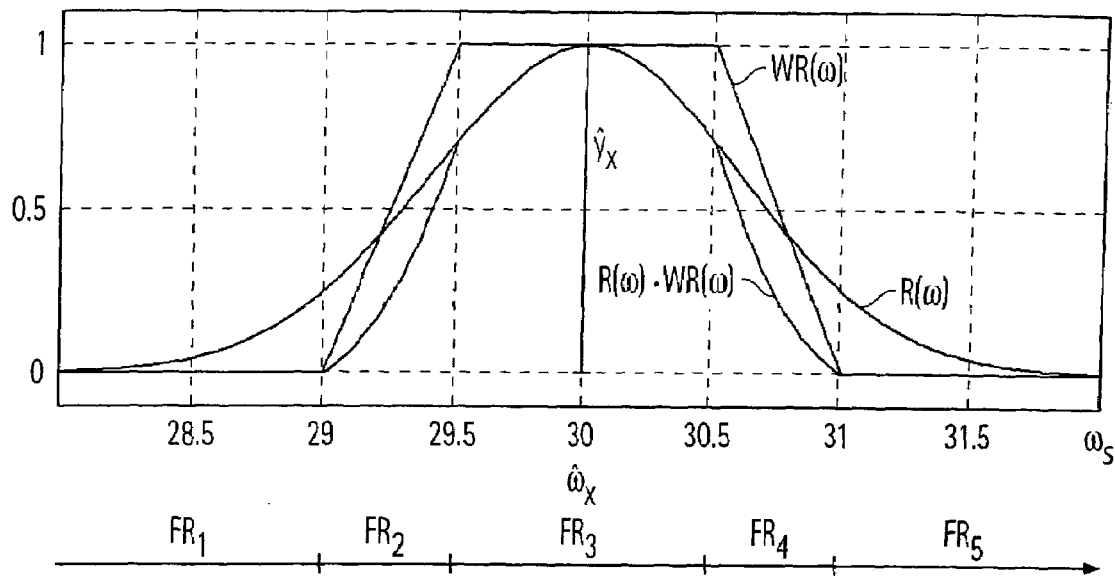
FIG. 5 shows the frequency response of the resolution filter $R(\omega)$, the weighting function $WR(\omega)$ of the frequency response of the resolution filter and the product $R(\omega) \cdot WR(\omega)$.

The remaining step is to reconstruct the spectrum envelope $E(\omega)$. In the frequency range $FR_3$ around center frequency $\omega_x$ and partly in the frequency ranges $FR_2$ and $FR_4$ the known resolution filter frequency response $R(\omega)$ is used. FIG. 5 shows the resolution filter frequency response $R(\omega)$ which has the maximum $\hat{y}_x$ obtained from formula (10) and the estimated center frequency $\hat{\omega}_x$ obtained from formula (9) as fitting parameters. The resolution filter frequency response $R(\omega)$ is weighted by a weighting function $WR(\omega)$, which is also shown in FIG. 5. The weighting function $WR(\omega)$ equals 1 in the frequency range $FR_3$, equals 0 in the frequency ranges $FR_1$ and $FR_5$ and descends from 1 to 0 in the frequency ranges $FR_2$ and $FR_4$. The resulting function $R(\omega) \cdot WR(\omega)$ can be seen from FIG. 5 additionally.

Figure 6:
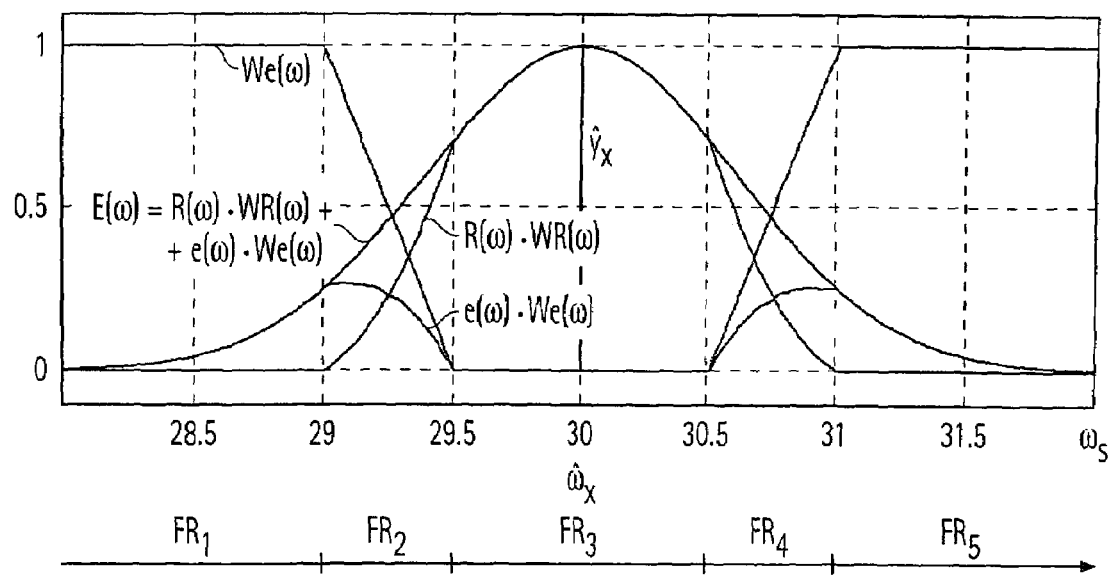
FIG. 6 shows the weighting function $We(\omega)$ of the envelope obtained from the maxima of the filtered base signal of the resolution filter, the products $e(\omega) \cdot We(\omega)$, $R(\omega) \cdot WR(\omega)$ and the resulting envelope $E(\omega)=R(\omega) \cdot WR(\omega)+e(\omega) \cdot We(\omega)$.

In the frequency ranges $FR_1$ and $FR_5$ far from center frequency $\omega_x$ the envelope $e(\omega)$ of the spectrum is reconstructed by using the maximum absolute values $y'_i$ of the filtered base band signal y as shown in FIGS. 2A, 2B, 3A and 3B. The respective weighting function for this "original" envelope $e(\omega)$ equals 1 in the frequency ranges $FR_1$ and $FR_5$, equals 0 in frequency range $FR_3$ and descends from 1 to 0 in frequency ranges $FR_2$ and $FR_4$. The resulting spectrum envelope $E(\omega)$ is obtained from $$E(\omega) = R(\omega) \cdot WR(\omega) + e(\omega) \cdot We(\omega) \tag{11}$$

and is additionally shown in FIG. 6.

If the input signal x(t) contains more than one spectral line the above described procedure has to be repeated for each spectral line.

In the above concept, polarity of a wavelet was assumed by comparing its peak with the peak of a previous wavelet. If it was greater, formula (4) for approaching was used, if it was smaller, formula (5) for leaving was used. The same information can be gained by comparing the width of the wavelet with the previous one. Preferably both of these heuristics are used to achieve the best possible noise resistance.

In the state of art embodiment the signal y(t) beyond resolution filter 4 is only the in-phase component I of the complex signal. The quadrature component Q of the base band signal is not available. This reduces the accuracy of the method.

The inventive improvement is related to the generation of the quadrature component Q to be additionally used for the envelope reconstruction. If not only the wavelets of the real in-phase component I of the filtered base band signal y(t) filtered by the resolution filter 4 but also the imaginary quadrature phase component Q of the filtered base band signal y(t) is available, the total number of wavelets which can be used for reconstructing the envelope is significantly increased. Thus, the accuracy of the method is increased. On the other hand, with a given accuracy which is to be reached the sweep velocity can be increased because even if the sweep velocity is doubled the same total amounts of useable wavelets is obtained compared to the state of the art method in which only the real component I is evaluated.

Figure 12A:
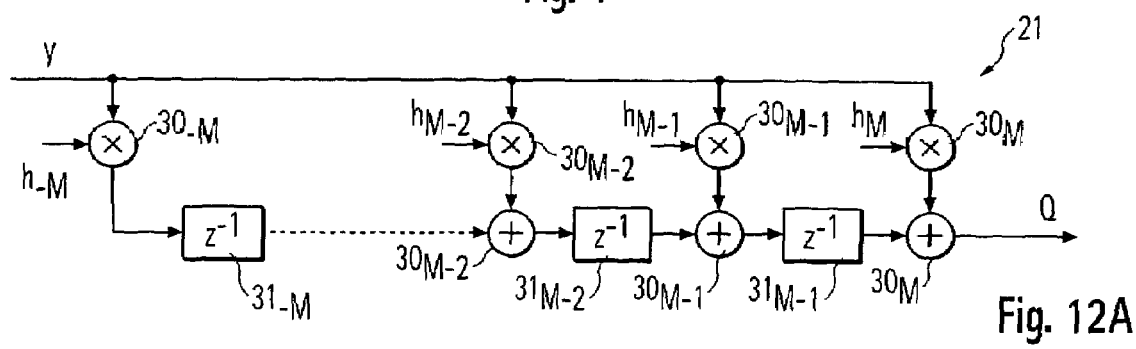
FIG. 12A shows a first embodiment of the Hilbert filter.
Figure 12B:
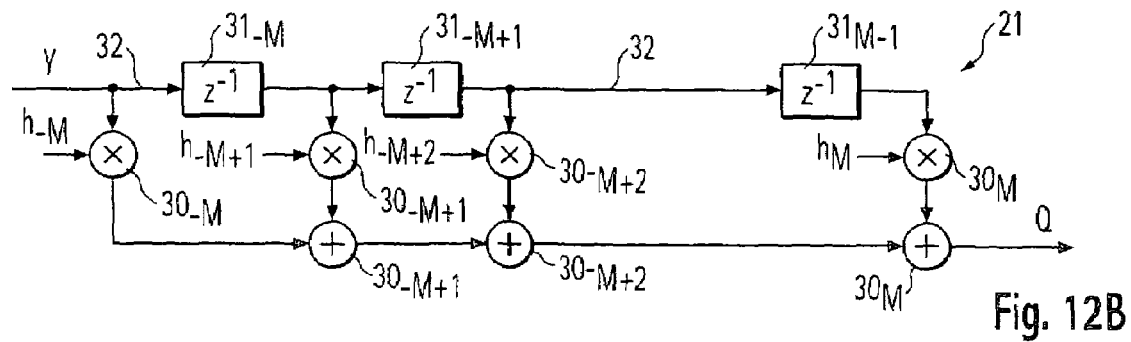
FIG. 12B shows a second embodiment of the Hilbert filter.
Figure 12:
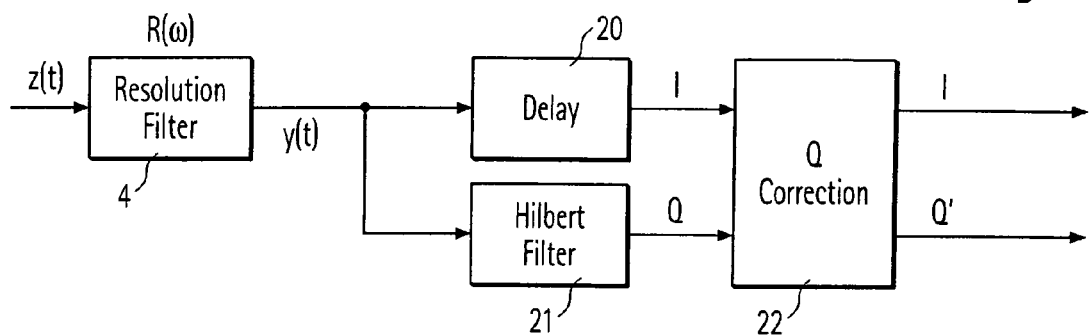
FIG. 12 shows a block diagram of a part of the inventive apparatus.
Figure 13:
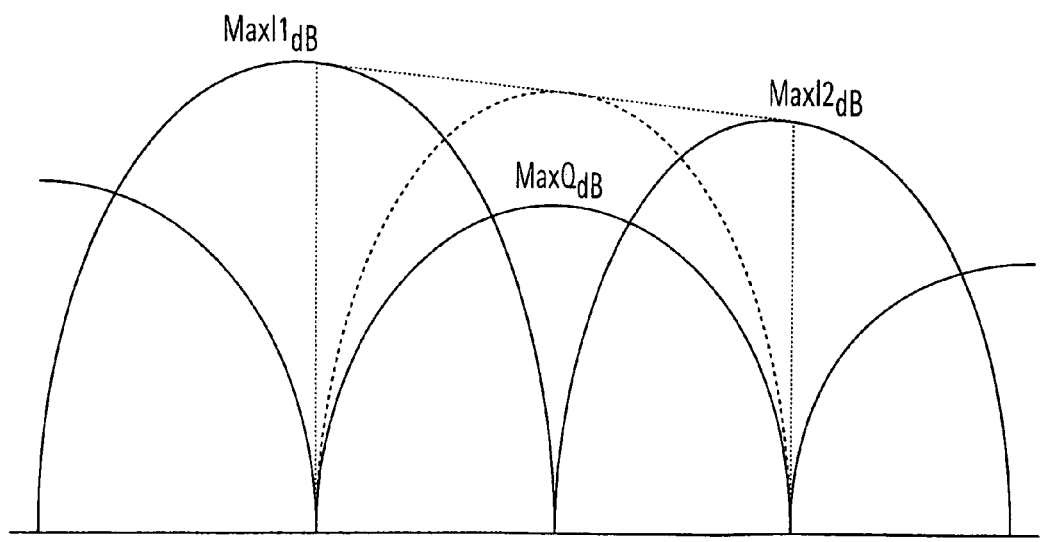
FIG. 13 shows the correction of the Q-peak values using the neighboring I-peak values.
Figure 16:
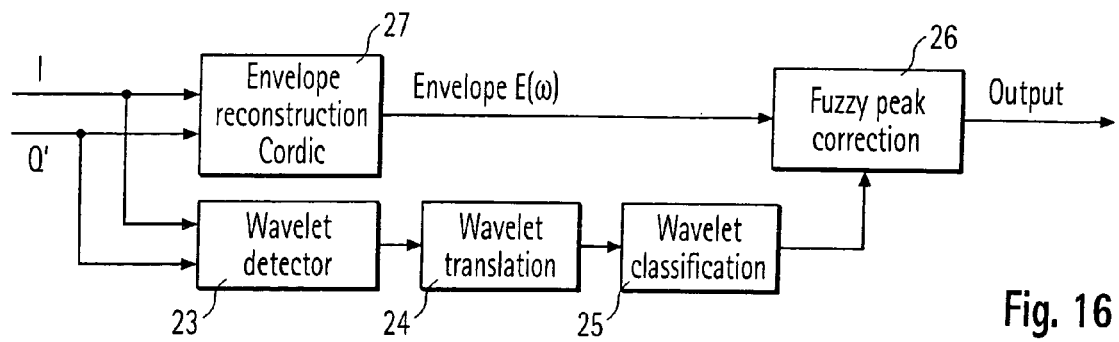
FIG. 16 shows another part of the inventive apparatus.

FIG. 12 shows a first part of the inventive apparatus whereas FIG. 16 shows a second part of the inventive apparatus. Only the components which are different from the state of the art apparatus shown in FIG. 1 are shown in FIG. 12 and 16. This means that only the resolution filter 4 and all parts following the resolution filter 4 are shown in FIGS. 12 and 13 and especially mixer 2 and local oscillator 3, which are shown in FIG. 1, are not shown in FIG. 12 but are also present in the inventive apparatus.

As shown in FIG. 12 the inventive apparatus comprises a Hilbert filter 21 for performing a Hilbert transform of the filtered base band signal y(t) filtered by the resolution filter 4. Thus, the input of the Hilbert filter 21 is connected to the output of resolution filter 4. Also, an optional delay buffer 20 is connected with its input to the output of resolution filter 4. The delay buffer 20 is preferred for the best mode apparatus but is optional. The output of the Hilbert filter 21 and of the delay buffer 20 are connected to a correction unit 22.

As shown in FIG. 16 the real in-phase component I and also the output with the imaginary quadrature corrected component Q' are supplied to the envelope reconstruction unit 27. The output of the envelope reconstruction unit 27 is connected with the input of a Fuzzy peak correction unit 26 which outputs the corrected envelope signal. The outputs of the in-phase component I and of the quadrature phase component Q' of the correction unit 22 are also both connected with wavelet detector 23. The output of wavelet detector 23 is connected with the wavelet translation unit 24. The output of the wavelet translation unit 24 is connected with wavelet classification unit 25. The output of the wavelet classification unit 25 is connected with Fuzzy peak correction unit 26 in order to control the Fuzzy peak correction in the Fuzzy peak correction unit 26. The function of the block elements shown in block diagrams of FIG. 12 and 16 will be explained later on.

According to the invention the Hilbert transformation is used to generate the imaginary quadrature component Q from the real in-phase component I. The Hilbert transformation is carried out in Hilbert filter 21. Preferably Hilbert filter 21 is realized as a finite impulse response digital filter FIR-filter. FIG. 12A and FIG. 12B show two possible embodiments of such a FIR-filter. It should be noted that also other embodiments of Hilbert filter 21 are possible within the scope of the present invention.

As shown in FIG. 12A the filtered base band signal y filtered by the resolution filter 4 is inputted to the Hilbert filter 21. The filtered base band signal y is supplied to a number of multipliers $30_{-M} \ldots 30_{M-2}, 30_{M-1}, 30_M$. The first multiplier $30_{-M}$ is connected with a first delay element $31_{-M}$ which is connected to a first adder not shown in FIG. 12A. The FIR-filter shown in FIG. 12A comprises several such structure elements designated as tabs. In the shown embodiment there are 2M tabs. Each adder $30_{M-2}, 30_{M-1}, 30_M$ receives the value of the delay element of the proceeding tab and of a respective multiplier and outputs the added value to the next delay element. Each multiplier $30_{-M} \ldots 30_M$ multiplies the digital input value of the filter base band signal y with a specific coefficient $h_n$. As the index n runs from −M to +M there are 2M+1 different coefficients.

FIG. 12B shows a different embodiment of a digital FIR-filter. The difference with respect to the embodiment shown in FIG. 12A mainly is that the delay elements $31_{-M} \ldots 31_{M-1}$ are not located between the adders $30_{-M+1} \ldots 30_M$ but in the input line 32 of the multipliers $30_{-M} \ldots 30_M$.

It should be noted that in the preferred embodiment resolution filter 4 and all elements downstream of the resolution filter 4 are in the digital regime and are realized by digital signal processing. Thus, as shown in FIG. 1 an analog/digital-converter 33 is situated between mixer 2 and resolution filter 4. However, in other embodiments of the inventive apparatus analog/digital-converter 33 can also be present before mixer 2 or between resolution filter 4 and Hilbert filter 21 for example.

The coefficients $h_n$ of Hilbert filter 21 shown in FIG. 12A and 12B are defined by $$h_n = \frac{1 - e^{jn\pi}}{n\pi}, n \neq 0, -M \leq n \leq +M \quad (12)$$

$$h_n = 0, n = 0$$

Figure 7:
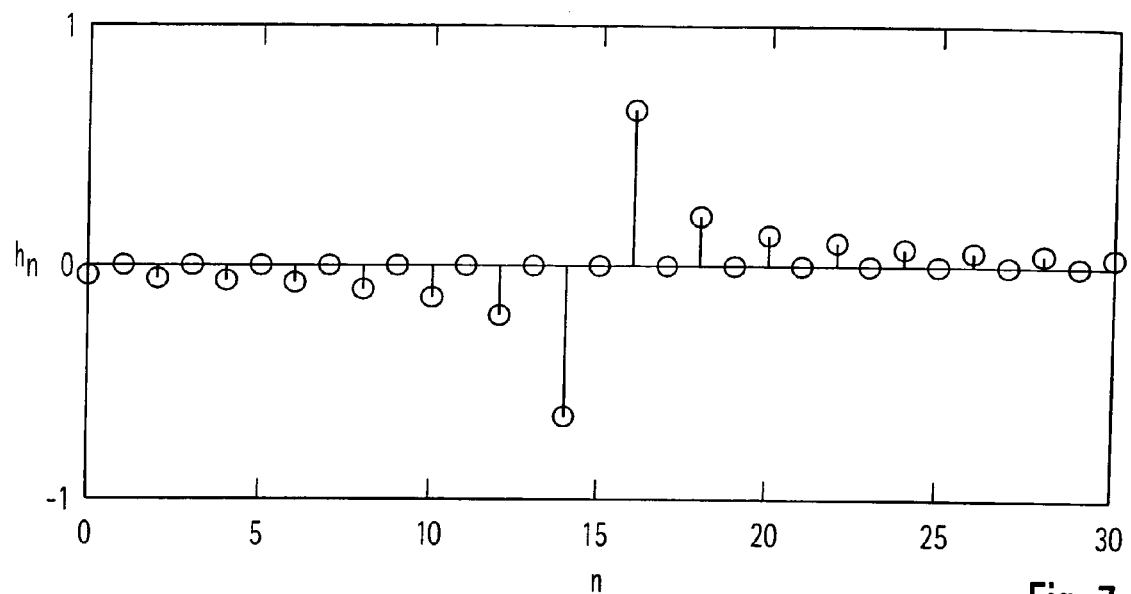
FIG. 7 shows the coefficients of a FIR filter used for implementation of the Hilbert filter.

Equation (12) shows that Hilbert transformation is not causal. Thus, an approximation has to be used. Preferably an approximation by FIR-filter with linear phase is used. The impulse response is symmetrically truncated to finite length and its delay is half of this length. As shown in FIG. 7 a preferred filter is a 31 taps FIR-filter. FIG. 7 shows the coefficients $h_n$ of the FIR-filter.

Choosing an odd number of taps causes half of the coefficients to be null. This optimizes the realization of this filter 21. Some variables have to be defined for further description as follows: $f_r$ is the frequency related to resolution bandwidth. Spp is the sampling frequency to resolution bandwidth ratio (typically 13.33).

Figure 8:
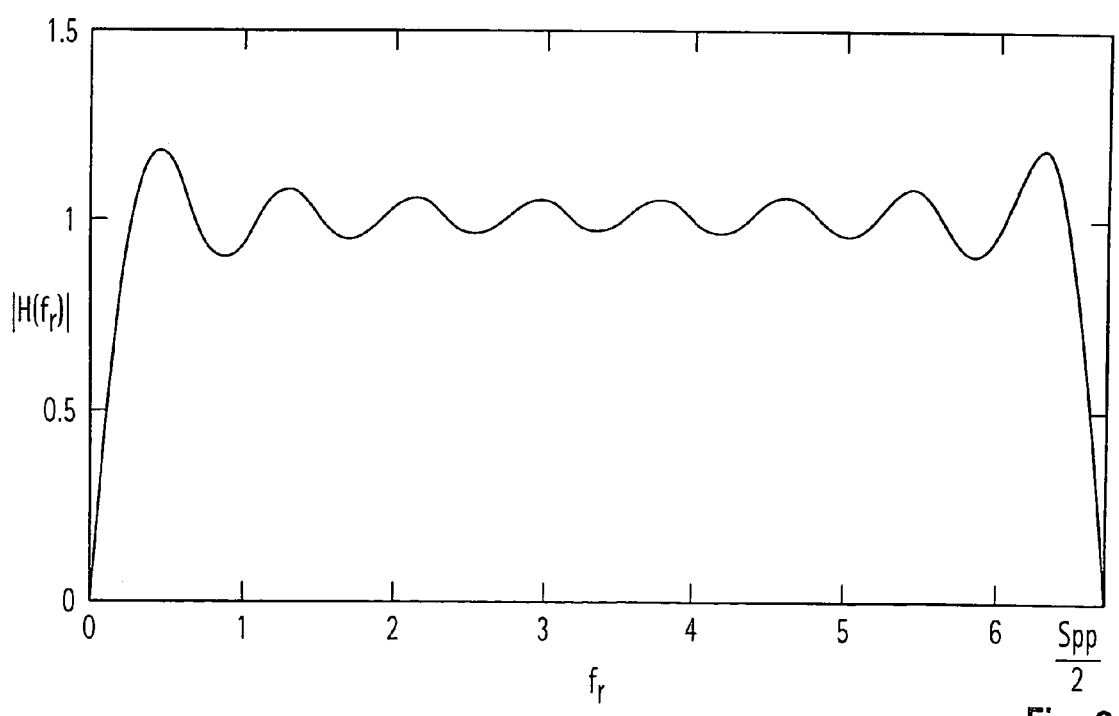
FIG. 8 shows a transfer function of the Hilbert filter in the frequency domain.
Figure 9:
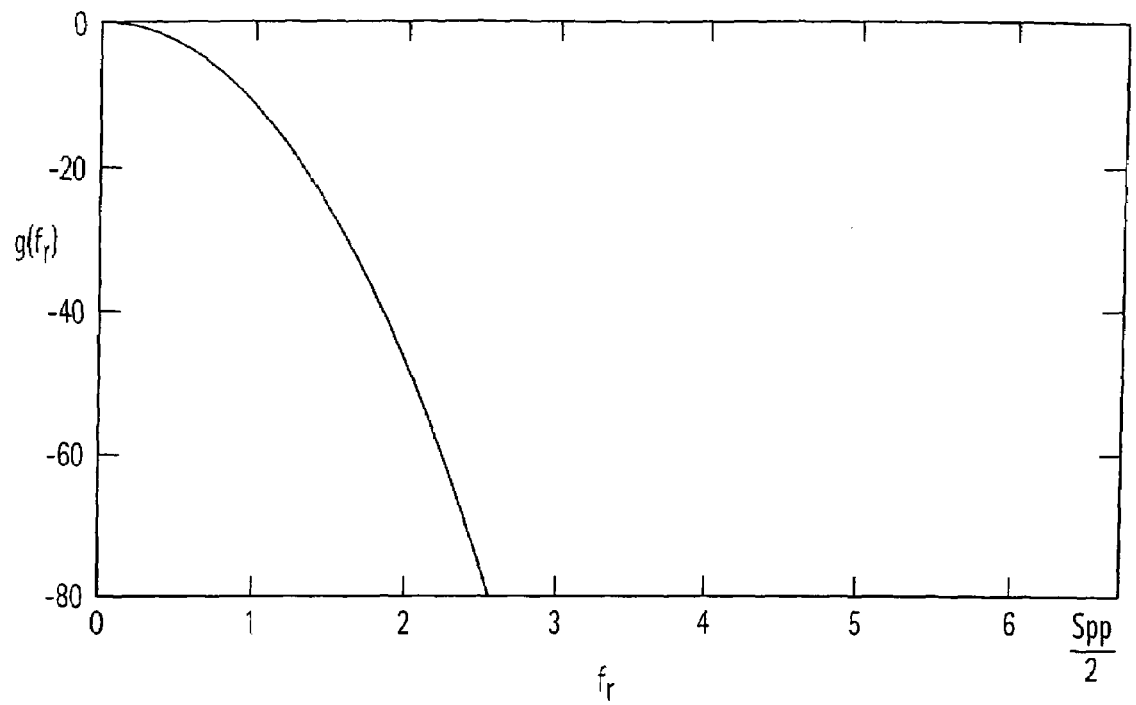
FIG. 9 shows the transfer function of the resolution filter.

FIG. 8 shows the transfer function $H(f_r)$ of the Hilbert filter in the frequency domain. The figure shows that the Hilbert filter approximation does not have a homogenous gain. Thus, the output signal Q should be corrected. Correction is mainly needed for frequencies that are passed through the Gauss resolution bandwidth filter 4. The Gauss curve of the transfer function of the resolution filter 4 is shown in FIG. 9.

For frequencies that are passed through the resolution filter 4 the Hilbert filter 21 has some ripple. Less taps of the Hilbert filter cause smaller ripple. Thus, a Hilbert filter 21 that has only 7 taps can be used. This helps to implement this filter for higher sampling rates and greater resolution bandwidths. The suppression of higher frequencies including noise is still insignificant.

Figure 10:
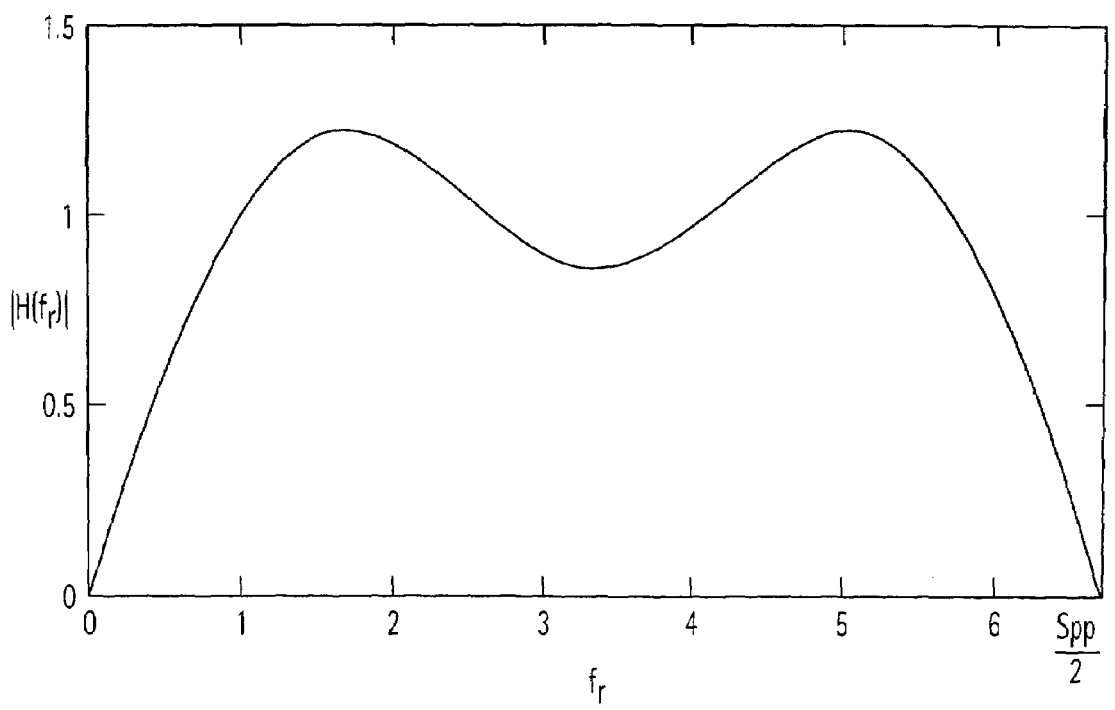
FIG. 10 shows the transfer function of the Hilbert filter in another implementation.
Figure 11:
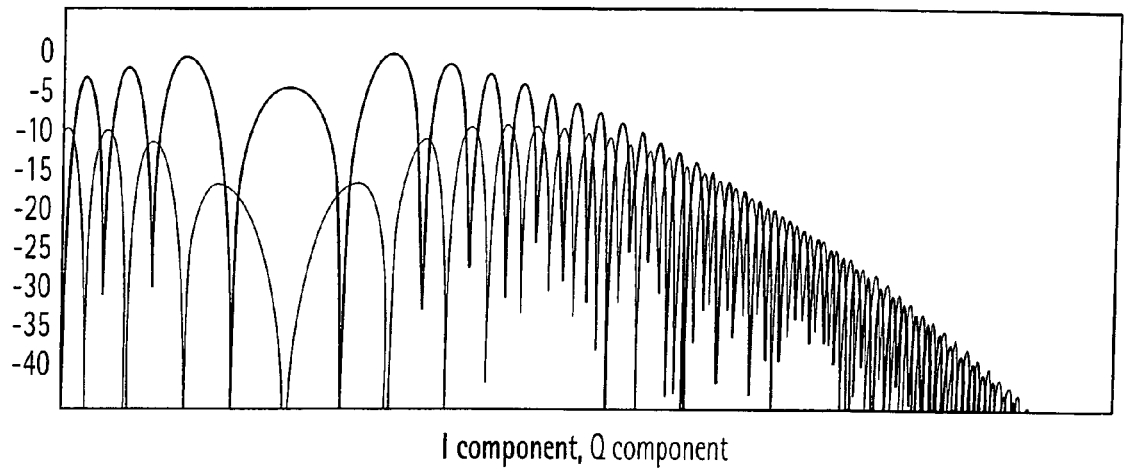
FIG. 11 shows traces of the I- and Q-component beyond the Hilbert filter.

FIG. 10 shows the frequency characteristic of the transfer function $H(f_r)$ of a 7 taps Hilbert filter. FIG. 11 shows traces of the I-component and created Q-component signal beyond the Hilbert filter 21 and the delay buffer 20. What is shown is the absolute value in the logarithmic scale. It can be seen that the Q-component has to be corrected to get accurate envelope. The method of correction is described hereafter.

The following text contains some terms which are defined as follows: Resolution trace I is the waveform of the signal y(t) beyond the resolution filter 4 created by sweeping over a single frequency (see I-component in FIG. 11). Resolution trace Q is the waveform of the signal beyond the Hilbert filter 21 (see Q component in FIG. 11). Wavelet is the portion of the resolution trace (half-wave, section between two zero-crossings), described by its width (length in samples) and peak (maximum absolute value). Wavelet frequency offset is the frequency difference between the sweep signal and the input signal (assuming single frequency component in the input signal) at the time of the wavelet's occurrence, i.e. $w_x - w_s(t_{wavlet})$. Relative frequency offset is the frequency offset related to resolution bandwidth of the resolution filter 4.

The block diagram of signal process with Q-correction is shown in FIG. 12. We have to insert the delay buffer 20 for the I-component to match correct Q samples at the output of the Hilbert filter 21 in order to compensate the runtime through Hilbert filter 21 by the delay buffer 20. Q-correction is performed in correction unit 22. The mixer 2, local oscillator 3 and resolution filter 4 are identical with the embodiment of FIG. 1 and thus not shown in FIG. 12. The output of resolution filter 4 is provided to Hilbert filter 21 and delay buffer 20.

The easiest method for Q-correction is to multiply the whole Q wavelet, so that its peak is the average of the I peaks beside it in logarithm scale, as shown in FIG. 13. This leads to formula (13).

$$Coef_{dB} = \frac{MaxI1_{dB} + MaxI2_{dB}}{2} - MaxQ_{dB} \quad (13)$$

Unfortunately signal processing is made in linear scale, so numerous mathematic operations are necessary. Thus, this method is not preferred for real-time signal processing.

Hilbert filter frequency response is known. As there is an exact relation between wavelet width and relative frequency offset, we can find a multiplying correction coefficient for each Q wavelet. It is $$f_r = \frac{Spp}{2 \cdot n} \quad (14)$$

wherein $f_r$ is the relative frequency

Spp is the sampling frequency to resolution bandwidth ratio n is the Q wavelet width.

Further, it is $$coef = H(f_r) \quad (15)$$

wherein coef is the multiplying coefficient $H(f_r)$ is the Hilbert filter frequency response.

There are only a few possible valid wavelet widths (preferably 2–32). Thus, it is helpful to prepare a correction table with two items n and coef. It is not necessary to correct wavelets greater than 32 samples. These wavelets are close to the signal, where frequency nears zero ($\omega_x - \omega_s \to 0$). If it is sufficiently precise to compute Q-component by a Hilbert filter 21 with a small number of tabs, additional correction of the peak is needed as described later on.

Because there is a small set of wavelet widths, that means also a small set of multiplying correction coefficients, the accuracy of this method is not sufficient. For the best results we have to combine both methods described above.

Figure 14:
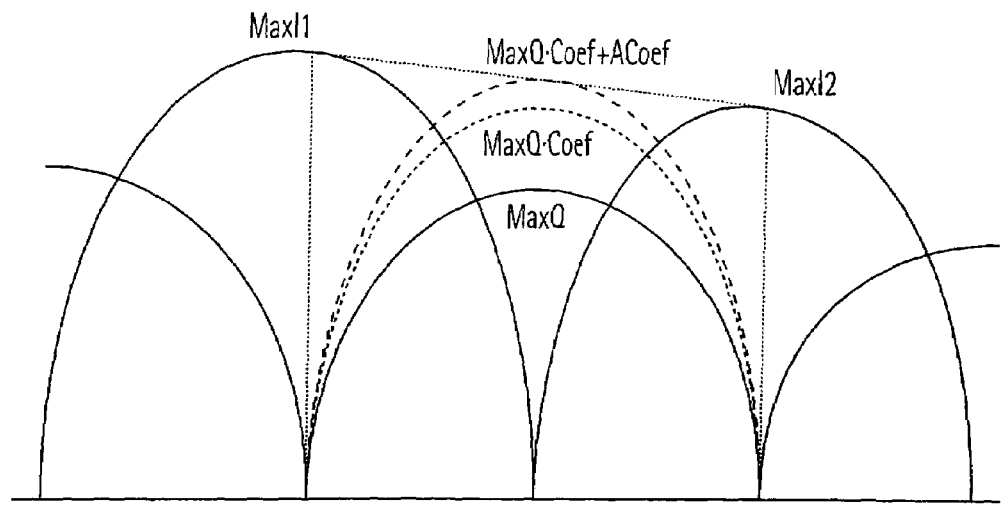
FIG. 14 shows the correction of the Q-peak value.

Each wavelet is multiplied by a coefficient according to a second method. Then the difference between the actual maximum and expected maximum is computed in linear scale by $$ACoef = \frac{MaxI1 + MaxI2}{2} - MaxQ \cdot Coef \quad (16)$$

and finally this difference ACoef is added to all samples of the wavelet. This simplification is allowable because the difference is small and it has practically no effect on the outputted envelope $E(\omega)$. This method is illustrated in FIG. 14.

The next step of the signal processing is computing the envelope $E(\omega)$ of the complex signal (I, Q') by the known cordic algorithm. This is accomplished in the envelope reconstruction unit 27. The cordic algorithm computes the magnitude and phase angle of a complex signal with the real component I and the imaginary component Q'. The magnitude represents the envelone $E(\omega)$.

A block diagram of the second part of the signal processing is shown in FIG. 16. As described, envelope reconstruction is located in cordic unit 22 which receives the components I and Q' from Q correction unit 22 shown in FIG. 12. Components I and Q' are also received by wavelet detector 23. The output of wavelet detector 23 is passed to wavelet translation unit 24. The output of the wavelet translation unit 24 is passed to wavelet classification unit 25. The function of units 23 to 25 is described later on in detail. The units work similar as wavelet detector 7 in FIG. 1.

Fuzzy peak correction unit 26 replaces envelope reconstruction unit 6 in FIG. 1.

Figure 15A:
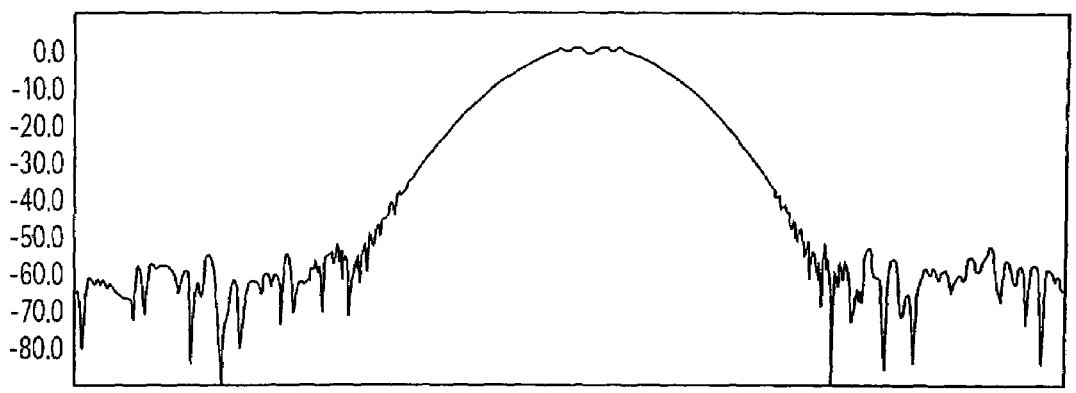
FIG. 15A.
Figure 15B:
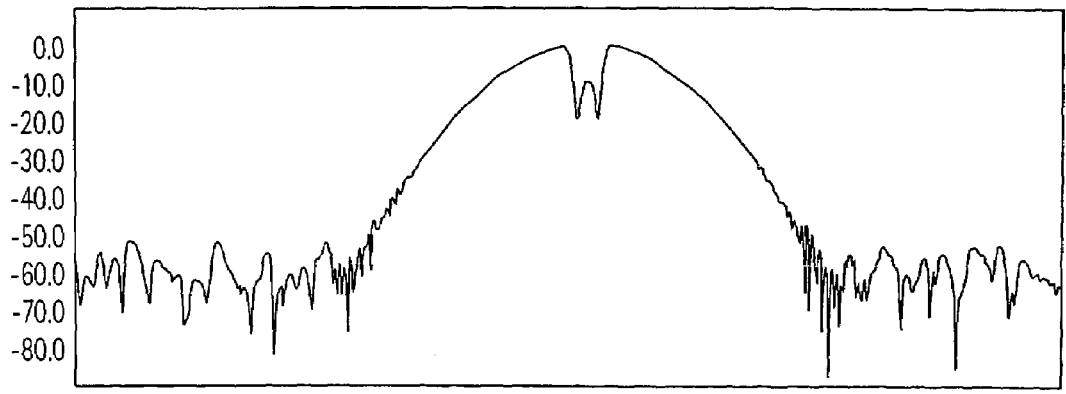
FIG. 15B show two examples of the uncorrected envelope.

FIGS. 15A and 15B show the signal beyond envelope reconstruction cordic unit 22 for a different initial phase. It can be seen that a peak correction is needed to get precise envelope trace, as it was mentioned before.

Peak correction is an algorithm detects frequency components from the resolution traces and then reconstructs respective parts of the envelope with the known shape of resolution filter $R(\omega)$.

For the following explanation the following terms have to be defined: Wavelet polarity is the sign of frequency offset. It is positive when the sweep approaches $w_x$. It is negative when the sweep leaves $w_x$. Wavelet detection range is the range of frequency offset at which wavelets are detected and taken valid for further processing. It matches the range of wavelet widths. Wavelet cumulation factor is the number of consequent half-waves in the resolution trace which compose the stream of wavelets. Nominal wavelet count is the theoretical number of wavelets that can be detected in an ideal resolution trace in a particular wavelet detection range. The k-factor is the relative sweeptime. The k-factor is defined by $$k = \frac{T_{sweep} \cdot \text{Span}}{RBW^2} \quad (17)$$

Figure 17:
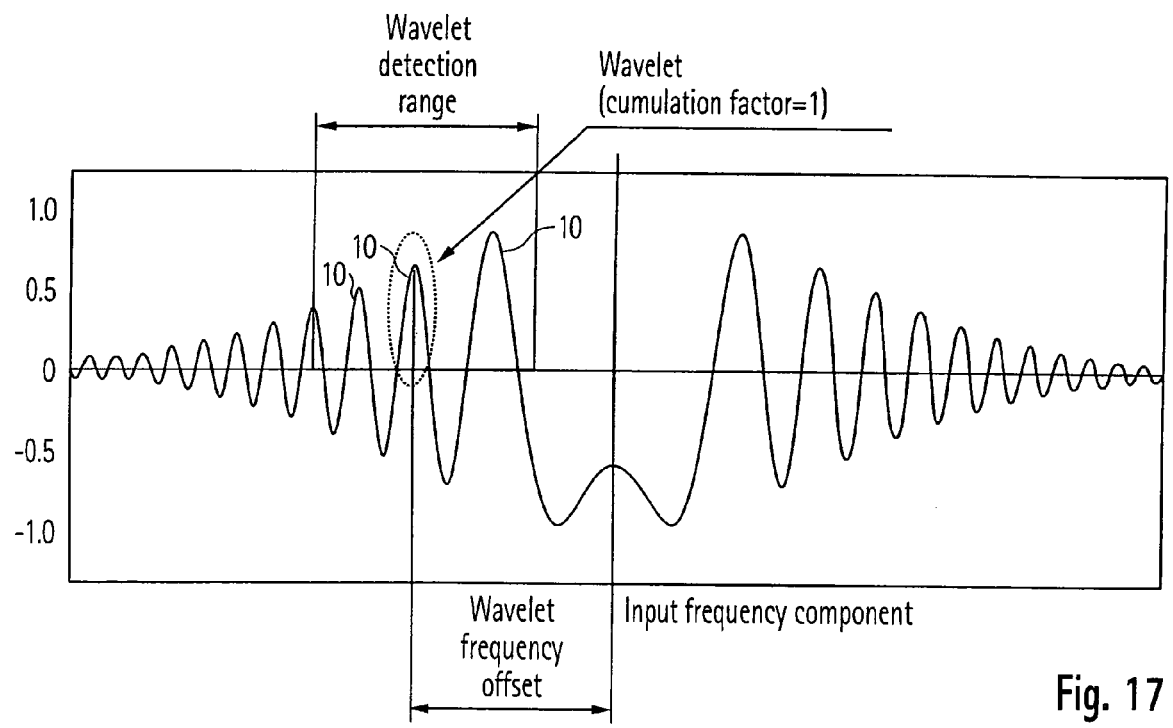
FIG. 17 shows the resolution trace of the I-component.

FIG. 17 shows the resolution trace of I-component (or Q-component respectively) where the frequency $\omega_s(t)$ of the sweep signal s(t) is close to an input frequency component $\omega_x$.

Width of the wavelet relates to the relative frequency offset by equation (18):

$$f_r = \frac{Spp}{2 \cdot n}, n = \frac{Spp}{2 \cdot f_r} \qquad (18)$$

Wavelets from a certain detection range have to be detected with wavelet detector 23. This means that only wavelets are needed that have their width in defined boundaries. This wavelet validation is made by wavelet detector 23 on both traces I and Q'. For further processing it is useful to have the same number of wavelets over different sweep conditions (Spp, k-factor).

Average wavelet width $\bar{n}$ over the detection range can be computed by:

$$\bar{n} = \frac{1}{f_{r2} - f_{r1}} \int_{f_{r1}}^{f_{r2}} \frac{Spp}{2 \cdot f_r} df_r \qquad (19)$$

The number of samples $n_{12}$ over the detection range is equal to:

$$n_{12} = k \cdot Spp \cdot (f_{r2} - f_{r1}) \qquad (20)$$

It follows that the nominal wavelet count NWC can be calculated by $$NWC = \frac{n_{12}}{\bar{n}} = \frac{2 \cdot k \cdot (f_{r2} - f_{r1})^2}{\ln \frac{f_{r2}}{f_{r1}}} \qquad (21)$$

It is not easy to find the boundaries $f_{r1}$ and $f_{r2}$ of the detection range to get the same nominal wavelet count NWC for different k. Best results are achieved by recursive computing as follows: The closest relative frequency of the detection range is chosen to be for example $f_{r1}=0.3$. There are no wavelets or wrong wavelets for frequencies below this limit.

The frequency offset in samples is $$n_0 = k \cdot Spp \cdot f_{r1} \qquad (22)$$

$n_m$ with $$n_m = n_{m-1} + \frac{Spp^2 \cdot k}{2 \cdot n_{m-1}} \qquad (23)$$

is counted M=NWC·Cumulation times. The frequency offset is $$f_{r2} = \frac{n_M}{k \cdot Spp} \qquad (24)$$

Now the minimum and maximum width can be computed by $$n = \text{Cumulation} \cdot \frac{Spp}{2 \cdot f_r} \qquad (25)$$

For the next processing it is desirable to have enough wavelets that are not too small. The polarity is generated by a polarity predictor. This predictor compares the width of present and previous wavelet and uses the knowledge of the resolution filter frequency response to estimate whether the sweep signal approaches or leaves the frequency component $\omega_x$ of the input signal.

Of course the amount of detected wavelets will be smaller in cases where the signal has a low s/n (signal/noise) ratio or where two close frequency components in comparison with resolution bandwidth are included.

Each wavelet can be transformed in wavelet translation unit 24 to give information about the input signal frequency component that caused its occurrence. The width of the wavelet relates to immediate frequency of resolution trace by equation (26):

$$f_y = \frac{1}{2 \cdot \text{width}} \qquad (26)$$

We can assume that:

$$f_x = f_s(t=\text{offset}) + f_y \text{ for positive wavelets} \qquad (27)$$

$$f_x = f_s(t=\text{offset}) - f_y \text{ for negative wavelets} \qquad (28)$$

wherein
  $f_x$ is the searched frequency
  $f_s$ is the immediate sweep frequency It is needed to process positive and negative wavelets separately. Once we have the streams of translated wavelets, we need a mechanism that will sum up these pieces of information to produce reliable description of emerging frequency components.

Figure 18:
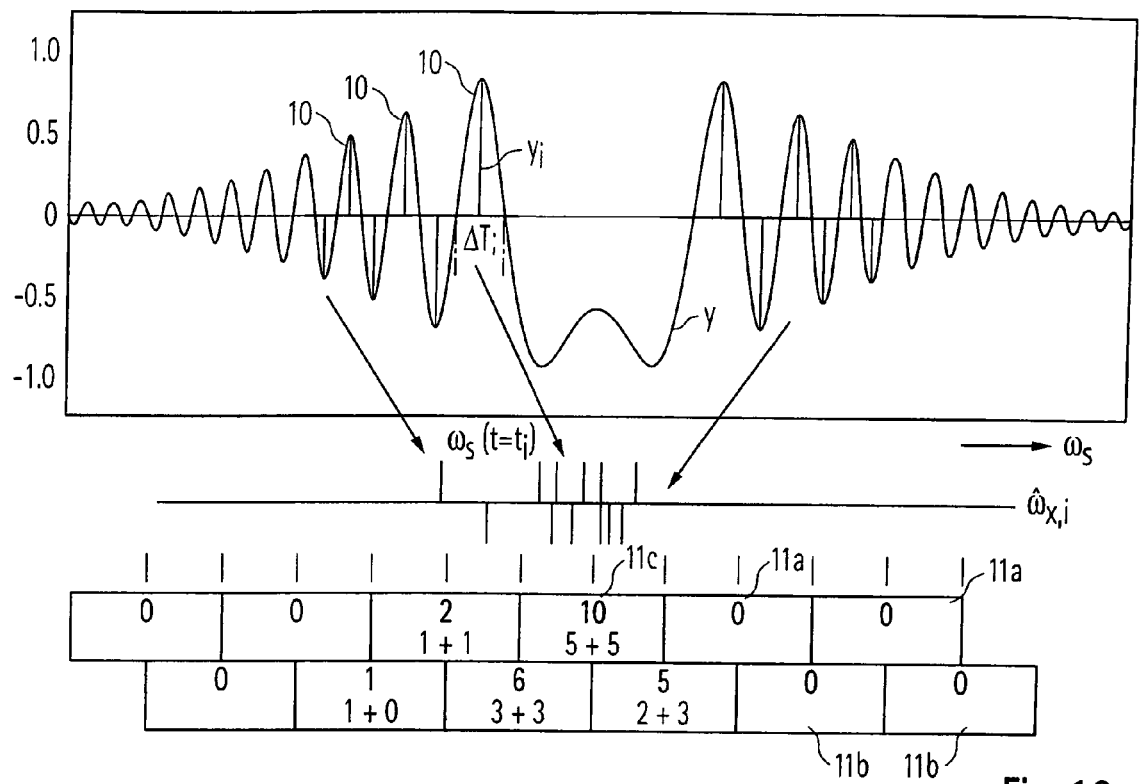
FIG. 18 shows projecting of the wavelets into discrete frequency classes and thresholding.

This is accomplished by projecting the wavelets into discrete frequency classes in the form of intervals 11*a*, 11*b* and by thresholding. FIG. 18 illustrates this process. In a real situation two traces I and Q are processed in order to have more useable wavelets.

The frequency classes are composed of intervals 11*a* and 11*b* used in wavelet classification unit 25 which are preferably overlapped by 50% to preserve the homogeneity of the frequency axis. Class width and threshold must be determined experimentally. It is preferred that the width of each class in samples is equal to 2·Spp. Well working threshold appears to be more than 8 wavelets.

By this process one frequency class (e.g. interval 11*c*) is selected. By averaging of all projected wavelet positions we can get the exact position where the peak correction should be applied. Together with this position we also have the count of projected positive or negative wavelets. This information is used to recognize whether there is an isolated peak or whether the peak is close to another peak and one type (approaching or leaving) of wavelets dominates or if the signal is noisy which results in less wavelets.

Now the Fuzzy peak correction performed in the correction unit 26 is described. At this part of the signal processing we have the envelope trace and accurate position of the needed correction. Now we have to compute the regular shape of the correction. The envelope trace is not replaced by this correction shape directly. Some fuzzy rules that improve the result can be used.

For the correction we need the levels of the envelope trace for the times when frequency offset is equal to ±0.5 RBW and ±1 RBW. RBW is the resolution bandwidth of resolution filter 4. Difference 0.5 RBW in samples can be computed by:

$$dif = \text{round}\left(k \cdot \frac{Spp}{2}\right) \qquad (29)$$

Figure 19:
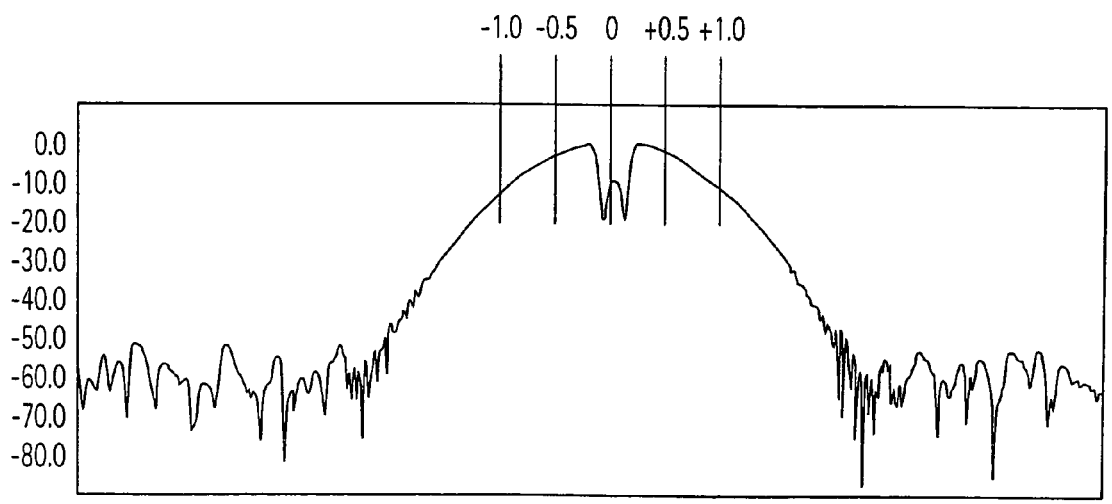
FIG. 19 shows different regions for the Fuzzy process.

Because the envelope trace is not ideal the levels in given times as the average of several samples have to be calculated. For example four numbers L(−1.0), L(−0.5), L(0.5), L(1.0) are received as shown in FIG. 19. Peak level L(0.0) is computed dependent on their differences and the number of wavelets. This is done in order to get a more stable amplitude value.

Figure 20:
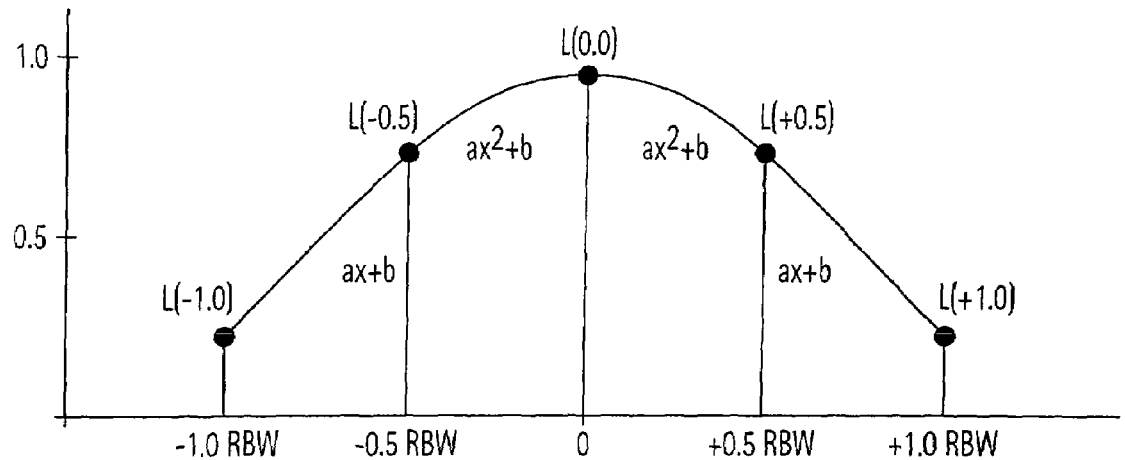
FIG. 20 shows an example of functions used in different ranges of the Fuzzy process.

Once all five levels are obtained, the regular shape of the corrected envelope can be created. These five points divide the correction shape into four parts as shown in FIG. 20. In each part both points are interpolated by some simple curves. All interpolation curves are computed in linear scale.

Figure 21:
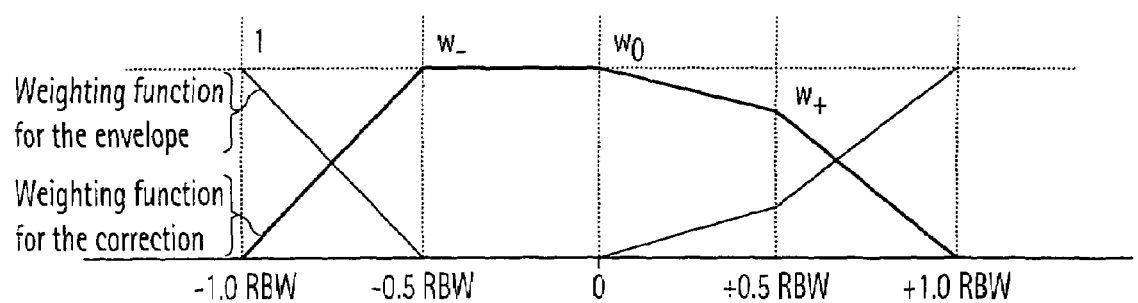
FIG. 21 shows the weighting functions used for correction in the Fuzzy process.

For the best approximation of the envelope and correction shape and for the better interpolation of noisy signals preferably weighting functions as shown in FIG. 21 are used.

The weights are preferably computed by $$w_- = \min(8, \text{PositiveWaveletCount})/8 \quad (30)$$

$$w_+ = \min(8, \text{NegativeWaveletCount})/8 \quad (31)$$

Also other conditions have effect on the weights. Less than two negative wavelets decrease weight $w_-$. On the other hand less than two positive wavelets decrease weight $w_+$. Weight $w_0$ is computed as the maximum of both weights $w_-$ and $w_+$ computed above.

Figure 22A:
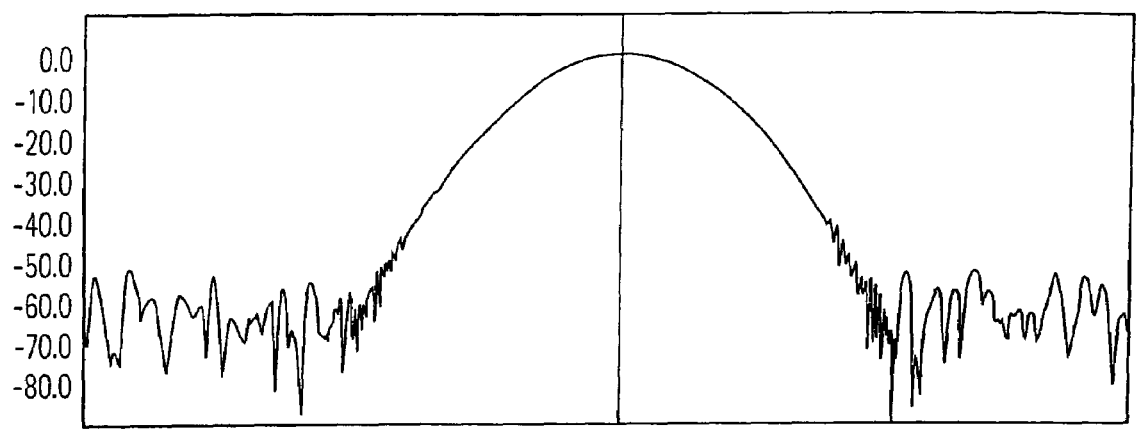
Figure 22B:
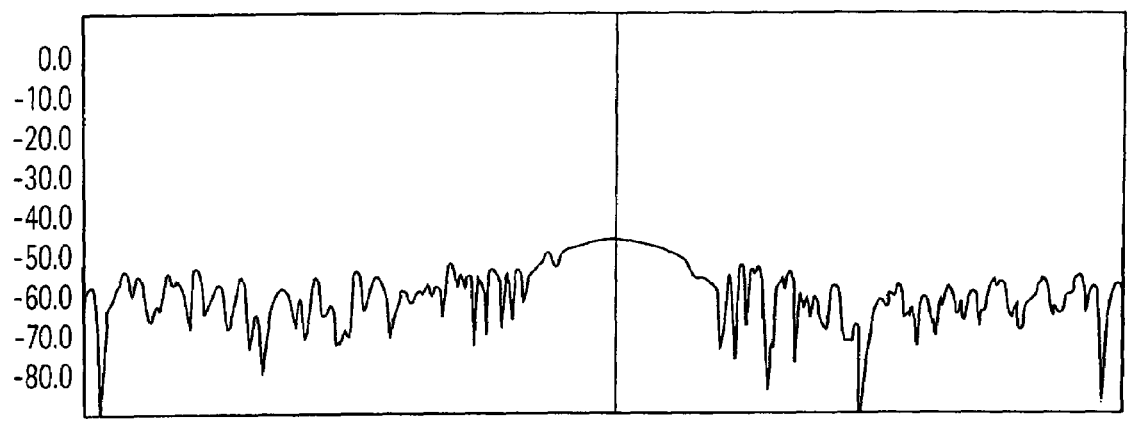
Figure 22C:
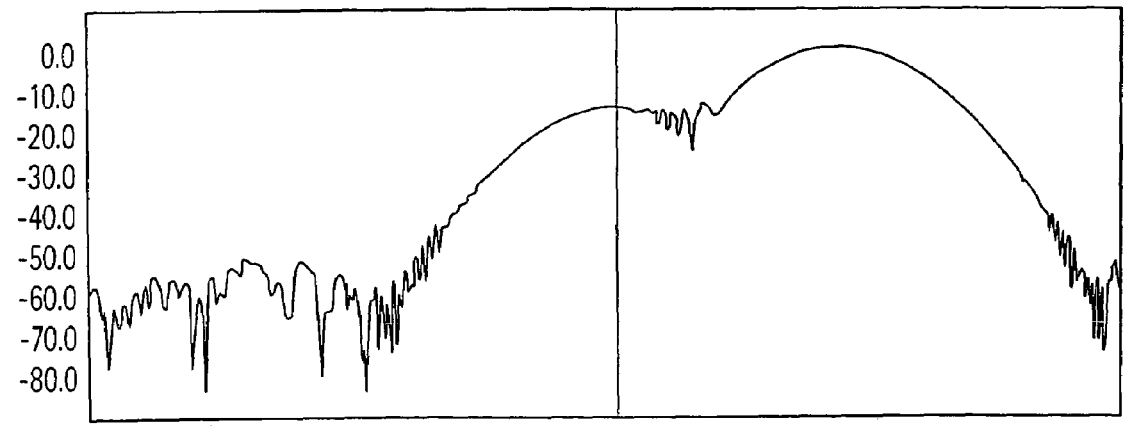
FIG. 22C show examples of envelope signals corrected with the inventive method in comparison to the ideal envelope.

In FIGS. 22A to 22C there are some examples of corrected signal plotted in dark lines in comparison to an ideal envelope plotted in light lines. FIG. 22A shows the result for a single frequency component $\omega_x$ in the input signal. FIG. 22B shows the result for a single frequency component in the input signal with a low signal/noise ratio. FIG. 22C shows the result for two close frequency components in the input signal. It can be seen that the used peak interpolation is sufficient.

What is claimed is:

1. A method for analyzing a spectrum of an input signal ($\chi(t)$) having at least one line with a center frequency ($\omega_x$) at the center of the line comprising the following steps:
   zero-mixing the input signal ($\chi(t)$) to produce a base band signal (y(t)) by sweeping a local oscillator frequency ($\omega_s$);
   filtering the base band signal (z(t)) with a resolution filter to produce a filtered base band signal (y(t); and
   reconstructing the envelope (E($\omega$)) of the spectrum of the input signal ($\chi(t)$) by using an estimated amplitude ($\hat{y}_x$) at an estimated center frequency ($\hat{\omega}_x$) of each line of the input signal ($\chi(t)$),
   wherein only the real component (I) of the base band signal (z(t)) is filtered with the resolution filter and the imaginary component (Q) is generated from the filtered base band signal (y(t)) by performing a Hilbert transform,
   wherein the amplitude values of the imaginary component (Q) generated by performing the Hilbert transform are corrected by an estimation on the basis of the neighboring amplitude values of the real component (I).

2. The method according to claim 1, wherein reconstructing the envelope (E($\omega$)) of the spectrum of the input signal ($\chi(t)$) is performed on the basis of the real component (I) and on the basis of the imaginary component (Q) generated with the Hilbert transform.

3. The method according to claim 1, wherein the real component (I) of the filtered base band signal (y(t)) is delayed by a delay time equivalent to the processing time of the Hilbert transform.

4. The method according to claim 1, wherein the Hilbert transform is performed by the use of a digital finite impulse response filter using the following coefficients:

$$h_n = \frac{1 - e^{jn\pi}}{n\pi}, n \neq 0, h_n = 0, n = 0$$

wherein n is an index running from a first negative integer (−M) to a second positive integer (+M).

5. The method according to claim 1, wherein the estimated amplitude ($\hat{y}_x$) and the estimated center frequency ($\hat{\omega}_x$) are calculated from the time of occurrence ($t_i$), the duration ($\Delta T_i$), and the maximum value ($y'_i$) of at least one evaluated halfwave of the real component (I) and of the imaginary component (Q) of the filtered base band signal (y(t)).

6. The method according to claim 5, wherein
   the range of estimated individual values of the center frequency ($\hat{\omega}_{x,i}$) is divided into intervals for the real component (I) and for the imaginary component (Q),
   the estimated individual values of the center frequency ($\hat{\omega}_{x,i}$) of all evaluated halfwaves are related to these intervals giving a count for each estimated value of the center frequency ($\hat{\omega}_{x,i}$) falling within the respective interval, and
   the estimated individual values of the center frequency ($\hat{\omega}_{x,i}$) and the estimated individual amplitude values ($\hat{y}_{x,i}$) at the center frequency are averaged only for the interval(s) having a minimum number of counts in order to obtain the estimated center frequency ($\hat{\omega}_x$) and the estimated amplitude ($\hat{y}_x$) at the estimated center frequency ($\hat{\omega}_x$).

7. The method according to claim 6, wherein the intervals overlap.

8. An apparatus for analyzing a spectrum of an input signal ($\chi(t)$) having at least one line with a center frequency ($\hat{\omega}_x$) at the center of the line comprising:
   a mixer for zero-mixing the input signal ($\chi(t)$) to produce a base band signal (z(t)) by sweeping a local oscillator frequency ($\omega_s$) generated by a local oscillator;
   a resolution filter for filtering the base band signal (z(t)) to produce a filtered base band signal (y(t)); and
   an envelope reconstruction means for reconstructing the envelope (E($\omega$)) of the spectrum of the input signal ($\chi(t)$) by using an estimated amplitude ($\hat{y}_x$) at an estimated center frequency ($\hat{\omega}_x$) of each line of the input signal ($\chi(t)$),
   wherein only the real component (I) of the base band signal (z(t)) is filtered with the resolution filter and the imaginary component (Q) is generated from the filtered base band signal (y(t)) by performing a Hilbert transform in a Hilbert filter arranged downstream of the resolution filter,
   wherein a means for correction corrects the amplitude values of the imaginary component (Q) generated by the Hilbert filter by an estimation on the basis of the neighboring amplitude values of the real component (I).

9. The apparatus according to claim 8, wherein in the envelope reconstruction means the reconstruction of the envelope (E($\omega$)) of the spectrum of the input signal ($\chi(t)$) is made on the basis of the real component (I) and on the basis of the imaginary component (Q) generated by the Hilbert filter.

10. The apparatus according to claim 8, wherein a delay means is arranged parallel to the Hilbert filter for delaying the real component (I) of the filtered base band signal (y(t)) by a delay time equivalent to the processing time of the Hilbert filter.

11. The apparatus according to claim 8, wherein the Hilbert filter is a digital finite impulse response filter using the following coefficients:

$$h_n = \frac{1 - e^{jn\pi}}{n\pi}, n \neq 0, h_n = 0, n = 0$$

wherein n is an index running from a first negative integer (−M) to a second positive integer (+M).

12. The apparatus according to claim 8, further comprising:
    a detector means for detecting the time of occurrence ($t_i$), the duration ($\Delta T_i$), and the maximum value ($y'_i$) of at least one halfwave of the filtered base band signal (y(t)), and
    a translation means, wherein an estimated amplitude ($\hat{y}_x$) and an estimated center frequency ($\hat{\omega}_x$) are calculated from the time of occurrence ($t_i$), the duration ($\Delta T_i$), and the maximum value ($y'_i$) of at least one evaluated halfwave of the real component (I) and of the imaginary component (Q) of the filtered base band signal (y(t)).

13. The apparatus according to claim 12, further comprising means for classification, wherein
    the range of estimated individual values of the center frequency ($\hat{\omega}_{x,i}$) is divided into intervals for the real component (I) and for the imaginary component (Q),
    the estimated individual values of the center frequency ($\hat{\omega}_{x,i}$) of all evaluated halfwaves are related to these intervals giving a count for each estimated value of the center frequency ($\hat{\omega}_{x,i}$) falling within the interval, and
    the estimated individual values of the center frequency ($\hat{\omega}_{x,i}$) and the estimated individual amplitude values ($\hat{y}_{x,i}$) at the center frequency are averaged only for the interval(s) having a minimum number of counts in order to obtain the estimated center frequency ($\hat{\omega}_x$) and the estimated amplitude ($\hat{y}_x$) at the estimated center frequency ($\hat{\omega}_x$).

14. The apparatus according to claim 13, wherein the intervals overlap.

15. A method for analyzing a spectrum of an input signal ($\chi(t)$) having at least one line with a center frequency ($\omega_x$) at the center of the line comprising the following steps:
    zero-mixing the input signal ($\chi(t)$) to produce a base band signal (y(t)) by sweeping a local oscillator frequency ($\omega_s$);
    filtering the base band signal (z(t)) with a resolution filter to produce a filtered base band signal (y(t)); and
    reconstructing the envelope (E(ω)) of the spectrum of the input signal ($\chi(t)$) by using an estimated amplitude ($\hat{y}_x$) at an estimated center frequency ($\hat{\omega}_x$) of each line of the input signal ($\chi(t)$);
    wherein only the real component (I) of the base band signal (z(t)) is filtered with the resolution filter and the imaginary component (Q) is generated from the filtered base band signal (y(t)) by performing a Hilbert transform;
    wherein the Hilbert transform is performed by the use of a digital finite impulse response filter using the following coefficients $$h_n = \frac{1 - e^{jn\pi}}{n\pi}, n \neq 0, h_n = 0, n = 0,$$

wherein n is an index running from a first negative integer (−M) to a second positive integer (+M).

16. An apparatus for analyzing a spectrum of an input signal ($\chi(t)$) having at least one line with a center frequency ($\omega_x$) at the center of the line comprising:
    a mixer for zero-mixing the input signal ($\chi(t)$) to produce a base band signal (z(t)) by sweeping a local oscillator frequency ($\omega_s$) generated by a local oscillator;
    a resolution filter for filtering the base band signal (z(t)) to produce a filtered base band signal (y(t)); and
    an envelope reconstruction means for reconstructing the envelope (E(ω)) of the spectrum of the input signal ($\chi(t)$) by using an estimated amplitude ($\hat{y}_x$) at an estimated center frequency ($\hat{\omega}_x$) of each line of the input signal ($\chi(t)$), wherein
        only the real component (I) of the base band signal (z(t)) is filtered with the resolution filter and the imaginary component (Q) is generated from the filtered base band signal (y(t)) by performing a Hilbert transform in a Hilbert filter arranged downstream from the resolution filter, and
        the Hilbert filter is a digital finite impulse response filter using the following coefficients $$h_n = \frac{1 - e^{jn\pi}}{n\pi}, n \neq 0, h_n = 0, n = 0,$$

wherein n is an index running from a first negative integer (−M) to a second positive integer (+M).

* * * * *